US011656281B2

United States Patent
Frymyer, Jr. et al.

(10) Patent No.: US 11,656,281 B2
(45) Date of Patent: May 23, 2023

(54) BATTERY PROBE SET

(71) Applicant: VERTIV CORPORATION, Columbus, OH (US)

(72) Inventors: Thomas W. Frymyer, Jr., Ostrander, OH (US); Ryan J. Riker, Holtsville, NY (US); Mark Carrillo, Islip, NY (US); James A. Laurie, Middletown, NJ (US)

(73) Assignee: Vertiv Corporation, Westerville, OH (US)

( * ) Notice: Subject to any disclaimer, the term of this patent is extended or adjusted under 35 U.S.C. 154(b) by 0 days.

(21) Appl. No.: 17/554,687

(22) Filed: Dec. 17, 2021

(65) Prior Publication Data

US 2022/0196744 A1 Jun. 23, 2022

Related U.S. Application Data

(60) Provisional application No. 63/127,809, filed on Dec. 18, 2020.

(51) Int. Cl.
*G01R 31/36* (2020.01)
*G01R 1/067* (2006.01)

(52) U.S. Cl.
CPC ..... *G01R 31/3644* (2013.01); *G01R 1/06788* (2013.01)

(58) Field of Classification Search
CPC .......... G01R 31/3644; G01R 1/06788
See application file for complete search history.

(56) References Cited

U.S. PATENT DOCUMENTS

| 4,210,862 | A | 7/1980 | Koslar |
| 4,540,940 | A | 9/1985 | Nolan |
| 5,059,895 | A | 10/1991 | Cataldi et al. |

(Continued)

FOREIGN PATENT DOCUMENTS

| CN | 207717824 U | 8/2018 |
| CN | 208255379 U | 12/2018 |

(Continued)

OTHER PUBLICATIONS

URL: https://www.vertiv.com/globalassets/shared/cellcorder-crt400-brochure.pdf, Product: Accessories for CRT-400 Cell Resistance Tester, Vertiv, Downloaded Sep. 8, 2020, 4 pages.

(Continued)

*Primary Examiner* — Paresh Patel
(74) *Attorney, Agent, or Firm* — Suiter Swantz pc llo

(57) ABSTRACT

The present disclosure relates to a battery probe set configured to plug into a battery tester and impinge upon one or more terminals of a battery. The battery probe set includes first and second probe assemblies, each including a housing with gripping portions and conductive ports, probe stems of varying lengths that attach to the housing, and probe tips that couple to the probe stems. The housing, probe stem, and probe tips are electrically coupled via conductive paths. The first and second probe assemblies are electrically coupled via a transverse connector, permitting the location of probe plugs onto one of the probe assemblies that is configured to be pluggable into the battery tester. The probe tips are interchangeable and include a light source.

10 Claims, 8 Drawing Sheets

(56) References Cited

U.S. PATENT DOCUMENTS

| | | | |
|---|---|---|---|
| 5,103,165 A | | 4/1992 | Sirattz |
| 5,672,964 A | | 9/1997 | Vinci |
| 7,294,995 B1 | * | 11/2007 | Stevens ............... G01R 15/202 324/72.5 |
| 7,977,914 B2 | | 7/2011 | Bertness |
| 9,423,417 B2 | * | 8/2016 | Laurino .................. G01R 1/04 |
| 9,797,927 B2 | * | 10/2017 | McTigue ............... H01R 11/18 |
| 10,054,614 B2 | | 8/2018 | Qiu et al. |
| 2010/0090682 A1 | * | 4/2010 | Armstrong ......... G01R 1/06788 324/149 |
| 2010/0213961 A1 | | 8/2010 | Jaite et al. |
| 2014/0092512 A1 | | 4/2014 | Fan |
| 2017/0052216 A1 | * | 2/2017 | Campbell .......... G01R 1/06705 |
| 2018/0120350 A1 | * | 5/2018 | Kunze ................ G01R 1/06722 |

FOREIGN PATENT DOCUMENTS

| | | |
|---|---|---|
| DE | 2626955 A1 | 12/1977 |
| DE | 2725086 A1 | 12/1978 |
| DE | 2756830 A1 | 6/1979 |

OTHER PUBLICATIONS

URL:https://www.amazon.com/Micsoa-Electronic-Multimeter-Alligator-Replaceable/dp/B075DWKSFB, Product: Test Leads Kit, Micsoa, Downloaded Sep. 8, 2020, 10 pages.
URL:https://www.enrgtech.co.uk/buy/product/ET16816795/L2020, Product: 4 mm Test Lead, Hioki, Downloaded Sep. 8, 2020, 1 page.
URL:https://www.globaltestsupply.com/product/hioki-I2100-pin-type-test-lead?gclid=
CjwKCAjw19z6BRAYEiwAmo64LXuxh3Sh6gDp733HLiMJQOB7uU_rtTNbC1F5lwDV6ardKPXU7CjFWhoCXkMQAvD_BwE, Product: L2100 Pin Type Test Lead, Hioki, Downloaded Sep. 8, 2020, 1 page.
Search Report and Written Opinion in International Application No. PCT/US2021/064391 dated Apr. 5, 2022, 10 pages.

* cited by examiner

BATTERY PROBE SET

PRIORITY

This application claims priority to U.S. Provisional Application No. 63/127,809 filed Dec. 18, 2020, which is incorporated by reference herein in its entirety. Any and all applications for which a foreign or domestic priority claim is identified in the Application Data Sheet as filed with the present application are hereby incorporated by reference under 37 CFR 1.57.

TECHNICAL FIELD

The present disclosure generally relates to the field of battery testing, and more particularly to battery testing probes.

BACKGROUND

Batteries are an important component in power management systems and are integral to power backup systems, such as uninterruptible power supplies (UPS). Care must be taken to maintain batteries within power backup systems, as failure may lead to explosions, fires, and personal injury. Battery failure in these systems is often attributed to improper battery ohmic values and/or improper intercell strap resistance. Frequent inspection of batteries may prevent system failures through detection of faulty batteries and battery components.

Measurement of battery impedance, resistance, and/or conductance is a particularly effective method for determining battery health. To make these measurements, battery test probes associated with a battery tester capable of measuring battery impedance, resistance and/or conductance are placed on the positive and negative terminals of a battery, and a measurement by the battery tester is obtained.

Many UPS systems contain an array of batteries, each of which needs to be inspected and tested on a regular basis. Batteries in UPS systems are often stored in cabinets that either require the batteries to be pulled out of the cabinet for testing, or require the batteries to be tested within the cabinet. Testing batteries within the cabinet is faster, safer, and less disruptive than removing the batteries from the cabinet. However, testing batteries within the cabinet may be difficult, particularly for those batteries furthest inside the cabinet, where battery terminal may be difficult to reach and difficult to see due to low light conditions. At the current time, battery probes for battery testers that test impedance, resistance, and/or conductance are not able to easily assess the battery terminal within the deepest regions of battery storage cabinets. As such, it would be advantageous to provide a system or apparatus to remedy the shortcomings of the conventional approaches identified above.

SUMMARY

This section provides a general summary of the disclosure, and is not a comprehensive disclosure of its full scope or all of its features.

In one aspect, the present disclosure is related to a battery probe set configured to plug into a battery tester and impinge upon one or more terminals of a battery. The battery probe set include a first probe assembly that includes a first housing that includes a first gripping portion and a first conductive port. The first probe assembly further includes a first probe stem mechanically coupled to a first end of the first housing, a first probe tip mechanically coupled to a first stem terminus of the first probe stem, and a first electronic circuitry configured within the first housing, the first probe stem and the first probe tip configured to conduct electrical current between the first probe tip and the first conductive port via a first conductive path. The first probe assembly further includes a transverse connector including a first connector end 164 and a second connector end configured to electrically couple the first connector end to the first conductive port.

The battery probe set further includes a second probe assembly, which includes a second housing configured with a second gripping portion, and a second conductive port, wherein the second conductive port is configured to electrically couple to the second connector end of the transverse connector. The second probe assembly further includes a second probe stem configured to couple to mechanically couple to a first end of the second housing, a second probe tip configured to mechanically couple to a second stem terminus of the second probe stem, and a first probe plug configured to mechanically couple to an output end of the second housing via a first plug cord. The second probe assembly further includes a second electronic circuitry configured within the second housing, the second probe stem and the second probe tip configured to conduct current between the second probe tip and the first plug cord via a second conductive path, and a second probe plug configured to mechanically couple to the output end of the second housing via a second plug cord, wherein the second plug cord is configured to electrically couple to the second conductive port within the second housing.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Reference will now be made in detail to the subject matter disclosed, which is illustrated in the accompanying drawings.

It is contemplated that the battery probe set could be operational for any battery tester, but the description provides a battery probe set operational for a battery tester that measures impedance, resistance, and/or conductance.

Accordingly, the present disclosure is directed to a battery probe set. More particularly, the present disclosure is directed to a modular battery probe set for a battery tester configured to measure impedance, resistance, and/or conductance. Specifically, the present disclosure is directed to a pair of probe assemblies of adjustable length and coupled via a transverse connector. In some embodiments, the probe assemblies are also configured with a probe light disposed on a probe tip.

Measurement of impedance, resistance, and/or conductance is valuable for determining the health of batteries in power backup systems like uninterruptible power supplies (UPS), as batteries with improper electrical characteristics may be prone to failure, fire, and even explosions. Current probe sets for battery testers typically include two probes that are wired or plugged into a battery tester. During a battery test, a first probe, a "Lo side" or negative probe that is typically indicated with black coloring, is placed into contact with the negative terminal on a battery, while a second probe, a "Hi side" or positive probe that is typically indicated with red coloring, is placed into contact with the positive terminal on a battery. The placement of the first and second probes on the terminals of the battery complete a circuit that allows the battery tester to determine an electrical characteristic of the battery. Regular testing of batteries in UPS and other power systems is valuable for maintenance of these systems.

Currently, battery probe sets are typically designed so that the probe tips are a relatively short distance (e.g., less than 10 cm) from the hand of the user. This can be problematic for UPS and other systems, as the batteries within these systems are stored within cabinets or other enclosures that make the terminals difficult to reach and/or make removal of batteries for testing difficult. Furthermore, the placement of batteries in these enclosures may make the terminals of the batteries difficult to see due to low light levels, particularly for batteries stored on shelves where there is little space between the battery terminal and the top of the shelf. As such, it would be advantageous to provide a system to remedy the shortcomings of the conventional approaches identified above.

Figure 1:
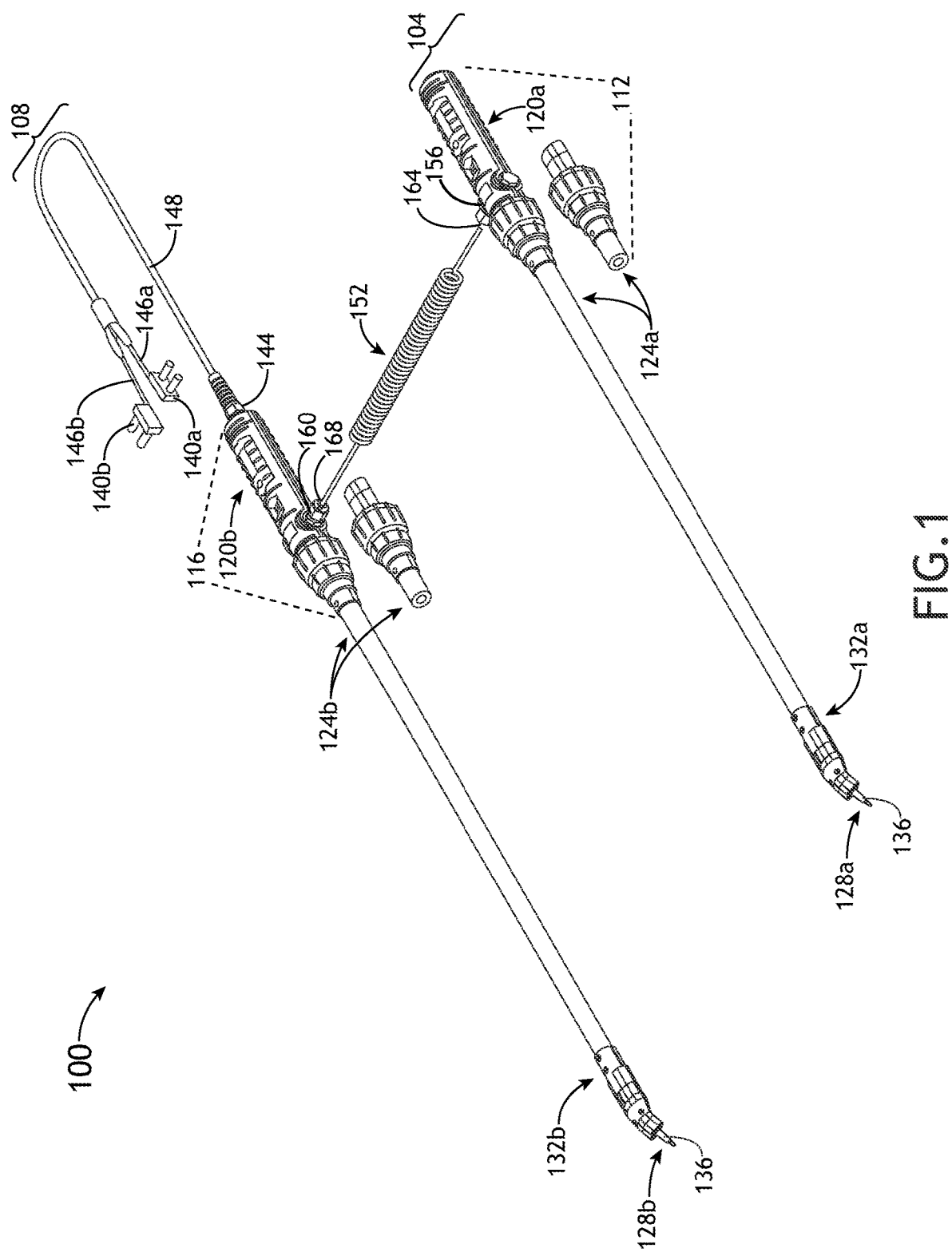
FIG. 1 is a diagram illustrating a battery probe set, in accordance with one or more embodiments of the disclosure.

Referring to FIG. 1, a battery probe set 100 of the present disclosure may include a first probe assembly 104 (e.g., a Lo side) and a second probe assembly 108 (e.g., a Hi side). Each probe assembly includes a housing 112, 116 (e.g., a first housing 112 and a second housing 116) configured with a gripping portion 120 (e.g., a hand grip). The gripping portion 120 is configured for a user to grip the housing when operating the battery probe set 100. The housing may be of any shape or size that permits the gripping of the housing by a user. The gripping portion 120 of the first probe assembly 104 (e.g., a first gripping portion 120a) and the gripping portion 120 of the second probe assembly 108 (e.g., a second gripping portion 120b) may have features such as bumps, ridges, and/or recesses that accentuate the grip by a user.

Each probe assembly, such as the first probe assembly 104 or second probe assembly 108, may further include a probe stem 124 (e.g., a first probe stem 124a or a second probe stem 124b) coupled to a first end of the housing via a stem coupling mechanism. The probe stem 124 extends the reach of the probe assembly and may be of any length. For example, the probe stem 124 may be over 750 mm (e.g., a long probe stem or long stick). For instance, a long probe stem 124 may be configured to lengthen the probe to a length of 36 inches. In particular, a probe stem length of 36 inches may allow a user to test a battery without any part of the body crossing a plane into a battery cabinet, effectively reducing the amount of protective equipment required to test batteries within a battery cabinet, such as required by US standards such as the Occupational Safety and Health Administration (OSHA) or European standards. In another example, the probe stem 124 may be less than 50 mm (e.g., a short probe stem 124 or short stick). For instance, a short probe stem 124 may be configured to lengthen the probe to a length of 14 inches. Different lengths of probe stems 124 may be interchanged within the battery probe set 100, permitting a user to adapt the battery probe set 100 for optimal use. For example, a long probe stem 124 may be coupled to the housing to test batteries located deep within a battery cabinet. In another example, a short probe stem 124 may be coupled to the housing to test batteries that are within a close vicinity, such as on a bench, table, or equipment rack.

Each probe assembly, such as the first probe assembly 104 or second probe assembly 108 further includes a probe tip 128 (e.g., a first probe tip 128a or a second probe tip 128b) mechanically coupled to a stem terminus 132 (e.g., a first stem terminus 132a or a second stem terminus 132b) via a tip coupling mechanism. The probe tip 128 includes a conductive pin 136 configured to make contact with a battery terminal 212a-b (shown in FIG. 2). The tip coupling mechanism permits switching of probe tips 128 with the probe assembly. For example, a probe tip 128 with a short conductive pin 136 assembled on the probe assembly may be switched via the tip coupling mechanism to a probe tip 128 with an extended conductive pin 136. The conductive pin 136 may be of any size or dimension. For example, the conductive pin 136 may have a width ranging from 5 mm to 60 mm. In another example, the conductive pin 136 may have a width ranging from 15 mm to 20 mm. The tip coupling mechanism and the stem coupling mechanism together are further configured to permit the switching of probe stems 124 while still retaining the use of a same probe tip 128. For example, a probe assembly with a short probe stem 124 and a probe tip 128 with an extended conductive pin 136 may exchange the short probe stem 124 for the long probe stem 124 while still retaining the same probe tip 128 with an extended conductive pin 136.

Figure 2:
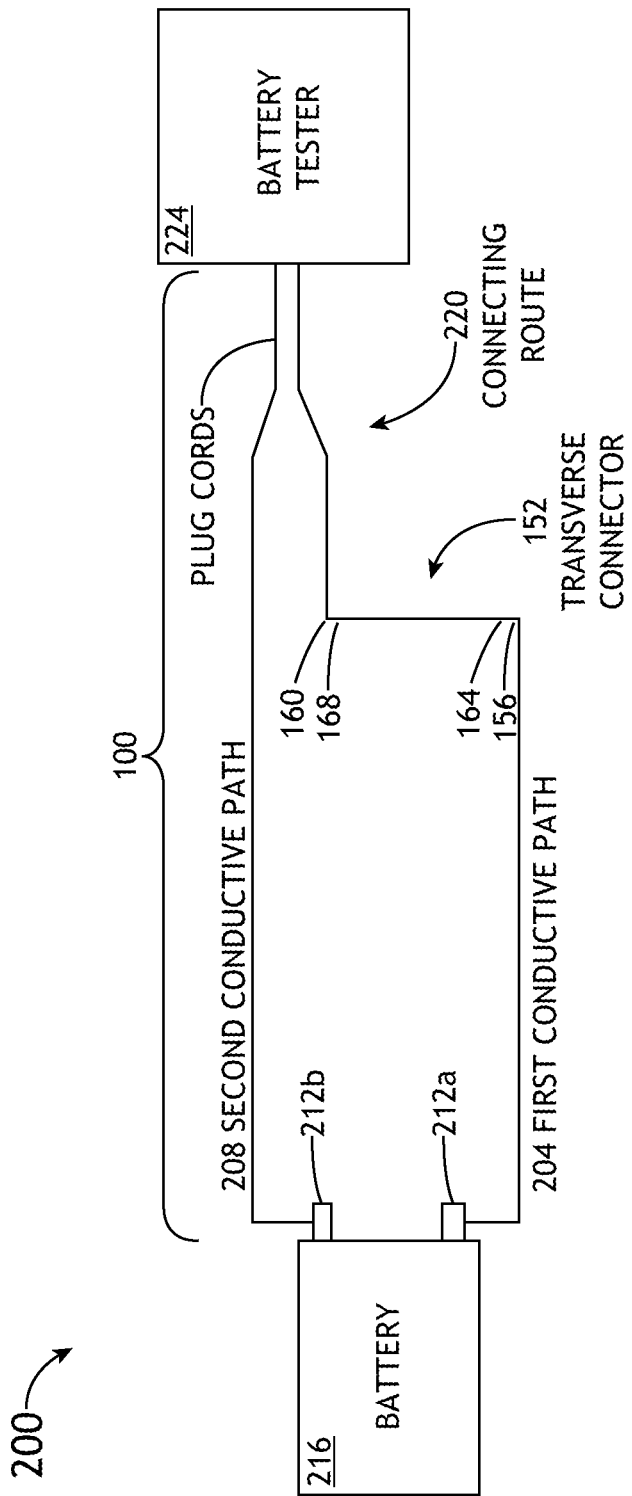
FIG. 2 is a block diagram illustrating circuitry of the battery probe set coupled to a battery and a battery tester, in accordance with one or more embodiments of the disclosure.

The battery probe set 100 further includes a probe plug 140 (e.g., a first probe plug 140a or a second probe plug 140b) configured to couple to a battery tester 224 (shown in FIG. 2). The probe plug 140 couples to an output end 144 of the housing 116 of the probe assembly (e.g., the second probe assembly 108) via a plug cord 148. In some embodiments, the plug cord 148 is a combined plug cord that is formed by entwining together two electrically isolated plug cord wires, a first plug cord 146*a* and a second plug cord 146*b*, that are coupled to the output end 144 of the probe assembly. The first plug cord 146*a* and the second plug cord 146*b* may be of any length. For example, the first plug cord 146*a* and/or the second plug cord 146*b* may be approximately three meters in length. In another example, the first plug cord 146*a* and/or the second plug cord 146*b* may be approximately one meter in length. The first plug cord 146*a* and/or second plug cord 146*b* may be configured with a banana-style electric coupler configured to plug into the battery tester 224.

The battery probe set 100 further includes a transverse connector 152 physically coupling the first probe assembly 104 to the second probe assembly 108. The transverse connector 152 may also electrically couple the first probe assembly 104 and the second probe assembly 108 via a first conductive port 156 conductive port disposed on the first probe assembly 104 and a second conductive port 160 disposed on the second probe assembly 108. The transverse connector 152 may include a first connector end 164 to connect with the first conductive port 156 and may include a second connector end 168 168 to connect with the second conductive port 160. The transverse connector 152 may be configured as a stretchable coiled cord made of an insulated wire that electrically couples the first conductive port 156 to the second conductive port 160. The coiled cord is configured to allow positioning of the first probe assembly 104 and the second probe assembly 108 at a range of positions to each other. For example, the coiled cord may be configured to permit use of the first probe assembly 104 and the second probe assembly 108 essentially adjacent to each other. In another example, the coiled cord may be configured to permit used of the first probe assembly 104 and the second probe assembly 108 approximately 600 mm from each other (e.g., with the probe assemblies 104, 108 arranged in a parallel configuration). The transverse connector 152 may be made of any material capable of providing mechanical and electrical coupling between the first probe assembly 104 and the second probe assembly 108.

The first probe assembly 104 further includes a first electronic circuitry configured to conduct electrical current in a first conductive path 204 (shown in FIG. 2) from the conductive pin 136 of the first probe tip 128*a* to the first conductive port 156. The first electronic circuitry is modular, as it includes electrically conductive material correlating to the first probe tip 128*a*, the first probe stem 124*a*, and the first housing 112 (i.e., when the first housing 112, the first probe stem 124*a*, and the first probe tip 128*a* are mechanically coupled, they also become electrically coupled.)

The second probe assembly 108 further includes a second electronic circuitry configured to conduct electrical current in a second conductive path 208 (shown in FIG. 2) from the conductive pin 136 of the second probe tip 128*b* to the second conductive port 160. The second electronic circuitry is modular as it includes electrically conductive material correlating to the second probe tip 128*b*, the second probe stem 124*b*, and the second housing 116 (i.e., when the second housing 116, the second probe stem 124*b*, and the second probe tip 128*b* are mechanically coupled, they also become electrically coupled).

The second probe assembly 108 may further include a connecting route 220 (shown in FIG. 2) between the second conductive port 160 and the first plug cord 146*a* (i.e., the connecting route 220 disposed inside the second housing 116). In this arrangement, current may flow between first probe tip 128*a* and the first probe plug 140*a* via the first conductive path 204, through the transverse connector 152 and the second conductive port 160 on the first probe assembly 104. This arrangement is configured so that the second housing 116 is mechanically connected at the output end to both the first plug cord 146*a* and the second plug cord 146*b*, reducing cord entanglement. In an alternative embodiment, transverse connector 152 may be directly coupled to the first electronic circuitry of the first probe assembly 104 and may be directly coupled to the second electronic circuitry of the second probe assembly 108, without use of a first conductive port 156 or a second conductive port 160. It is contemplated that use of the transverse connector 152 may advantageously reduce noise created within the battery probe set 100 and improve the test results.

FIG. 2 illustrates a schematic diagram of an example electrical environment 200 of the battery probe set 100. The first conductive path 204, enclosed within the first probe assembly 104 and impinging on a battery terminal 212*a*, is electrically coupled to the transverse connector 152, which is electrically coupled to the connecting route 220 (e.g., enclosed within the second probe assembly 108). The connecting route 220 then electrically couples to a respective plug cord before linking to a battery tester 224. The second conductive path 208, enclosed in the second probe assembly 108 and impinging on a battery terminal 212*b*, electrically couples to a respective plug cord before linking to the battery tester 224. The coupling of the battery probe set 100 to the battery and the battery tester 224 completes an electrical circuit, permitting the battery tester 224 to measure one or more electrical characteristics of the battery. In some embodiments, the example electrical environment 200 may include one or more electrical fuses. For example, the battery tester 224 may include an electrical fuse. In another example, the first conductive path 204 and or the second conductive path 208 may include an electrical fuse.

It should be understood that the first probe assembly 104 may be designated to probe the "Hi side" or positive terminal of the battery and that the second probe assembly 108 may be designated to probe the "Lo side" or negative terminal of the battery (i.e., either probe assembly may impinge upon any battery terminal 212*a-b*). Therefore, the above description should not be interpreted as a limitation of the present disclosure, but merely an illustration.

Figure 3:
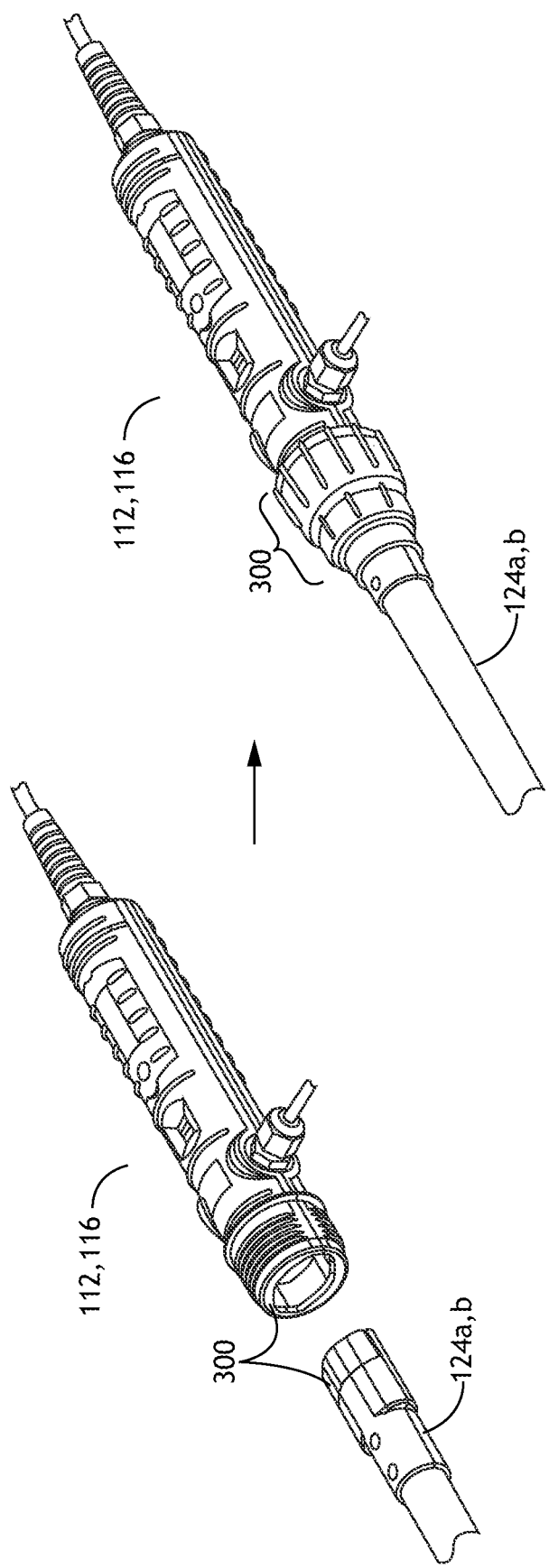
FIG. 3 is a diagram illustrating a housing of a probe assembly and a connecting end of a probe stem, in accordance with one or more embodiments of the disclosure.

Referring to FIG. 3, a stem coupling mechanism 300 may include a threaded connector. For example, the housing 112, 116 may be configured with male threads that are compatible with female threads on the probe stem 124 (e.g., the female threads formed directly on the stem or on a stem coupler). Upon connecting the threaded components, conductive components within the housing 112, 116 and probe stem 124 come into contact. In this manner, the housing 112, 116 and the probe stem 124 are both mechanically and electrically coupled. Other types of connectors known in the art may be used for mechanically coupling the housing 112, 116 with the probe stem 124 including but not limited to friction connectors (e.g., snap connectors), latch connectors, bolted connectors, and the like. In some embodiments, the probe stem 124 is keyed so that the probe stem 124 and the housing 112, 116 will couple in the proper orientation.

Figure 4:
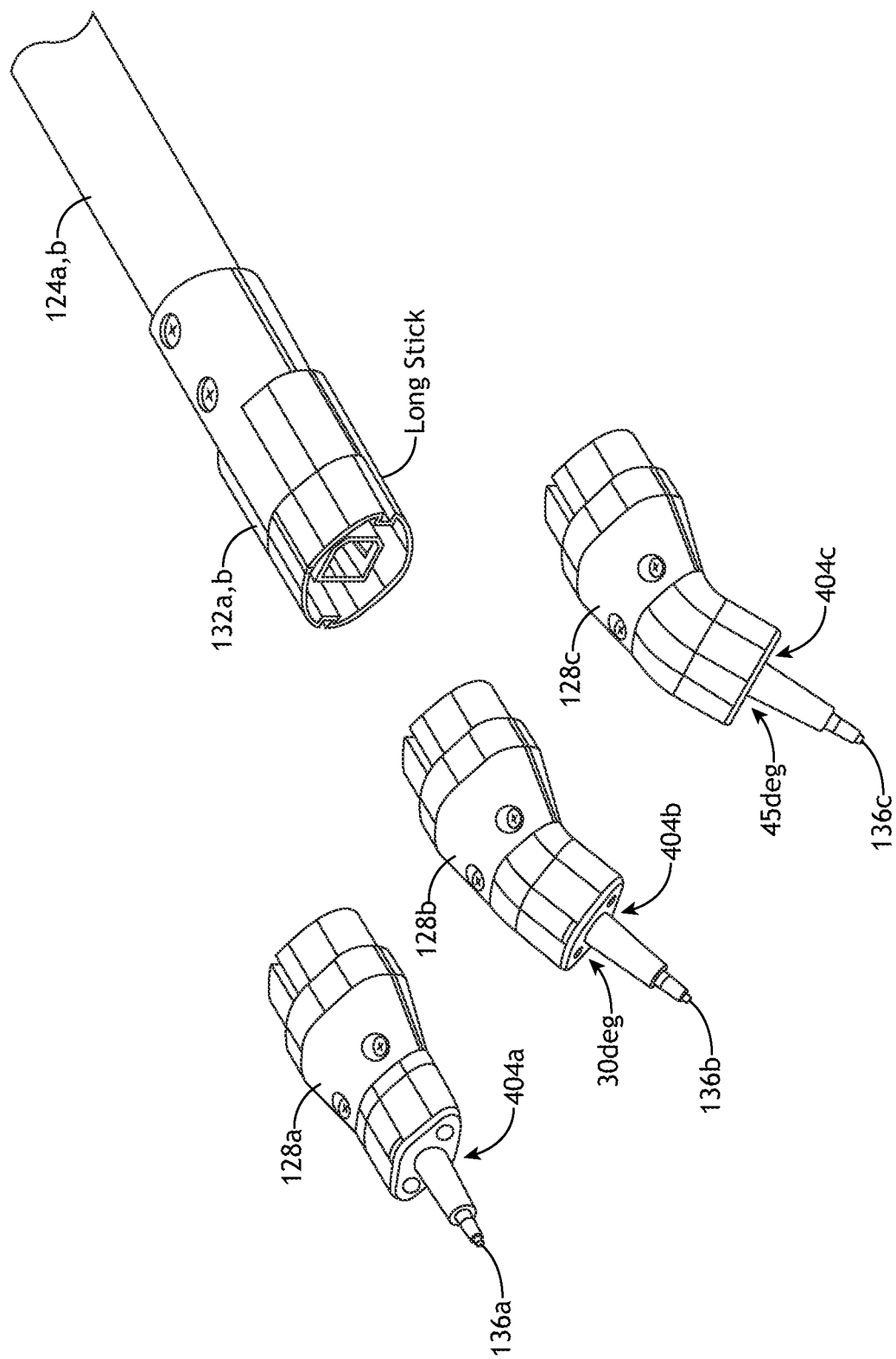
FIG. 4 is a diagram illustrating three probe tips and a stem terminus, in accordance with one or more embodiments of the disclosure.

Referring to FIG. 4, a mechanism for coupling a probe tip 128*a-c* to the first stem terminus 132*a* or second step terminus 132*b* (e.g., a tip coupling mechanism) may include a friction or tabbed connector. The tip coupling mechanism may facilitate removable and replaceable probe tips 128. For example, the probe stem 124 terminus may be configured with a recess that accepts the insertion of a portion of the probe tip 128. The tip coupling mechanism may be configured so that the insertion of the probe tip 128 into the recess results in a snug fit where the two components are held together by friction. In another example, the probe tip 128 may be configured with one or more tabs that, once pushed into the recess of the probe stem 124 terminus, expand into further indentations in the probe stem 124 terminus, holding the probe tip 128 into place. The tip coupling mechanism is configured so that insertion of the probe tip 128 into the probe stem 124 terminus also couples electrically conductive elements of the probe tip 128 and the probe stem 124, resulting in a probe tip 128 and a probe stem 124 that are mechanically and electrically coupled. Other types of connectors known in the art may be used for mechanically coupling the probe stem 124 terminus with the probe tip 128 including but not limited to threaded connectors, latch connectors, bolted connectors, and the like.

The battery probe set 100 may further include probe tips 128 with multiple structural configurations. For example, the battery probe set 100 may include probe tips 128 with conductive pins 136 oriented at different angles. For instance, the probe tip 128 may be configured with the conductive pin 136 oriented at an angle 45° relative to length-side or axis of the probe stem 124 (e.g., the probe tip 128*c* in FIG. 3). In another instance, the probe tip 128 may be configured with the conductive pin 136 oriented at an angle 30° relative to the axis of the probe stem 124 (e.g., the probe tip 128*b* in FIG. 3). In another instance, the probe tip 128 may be configured with the conductive pin 136 oriented an angle 0° relative to the axis of the probe stem 124 (e.g., the conductive pin 136*a* juts straight out in line with the probe stem 124). The probe tip 128 may include a conductive pin 136 configured at any angle. The probe tip 128 may also be configured to adjust the angle of the conductive pin 136. For example, the probe tip 128 and/or the probe coupling mechanism may be hinged, permitting a user to select an angle of the conductive pin 136.

The probe tip 128 may further include one or more light sources 404 configured to illuminate a battery 216 and/or battery terminal 212*a-b*, making the battery terminal 212*a-b* more easily discerned under low light conditions. The light source 404 may be of any type of light source 404 known in the art including but not limited to light emitting diodes (LED), organic light emitting diodes (OLED), incandescent bulbs, fluorescent lamps, halogen lamps, or compact fluorescent lamps. For example, the light source 404 may be a microLED.

In some embodiments, the probe tip 128 has a trigger mechanism that may be pressed against the battery terminal 212*a-b* to engage the tip end to take a measurement. For example, when the probe tip 128 is not pressed against the terminal, the circuit is open. The trigger mechanism prevents possible short circuiting and/or arc flashing. For example, the trigger mechanism may prevent short circuiting where one probe tip 128 is connected to a battery terminal 212*a-b* and the other probe tip 128 slips off and strikes another battery or the cabinet ground.

Figure 5:
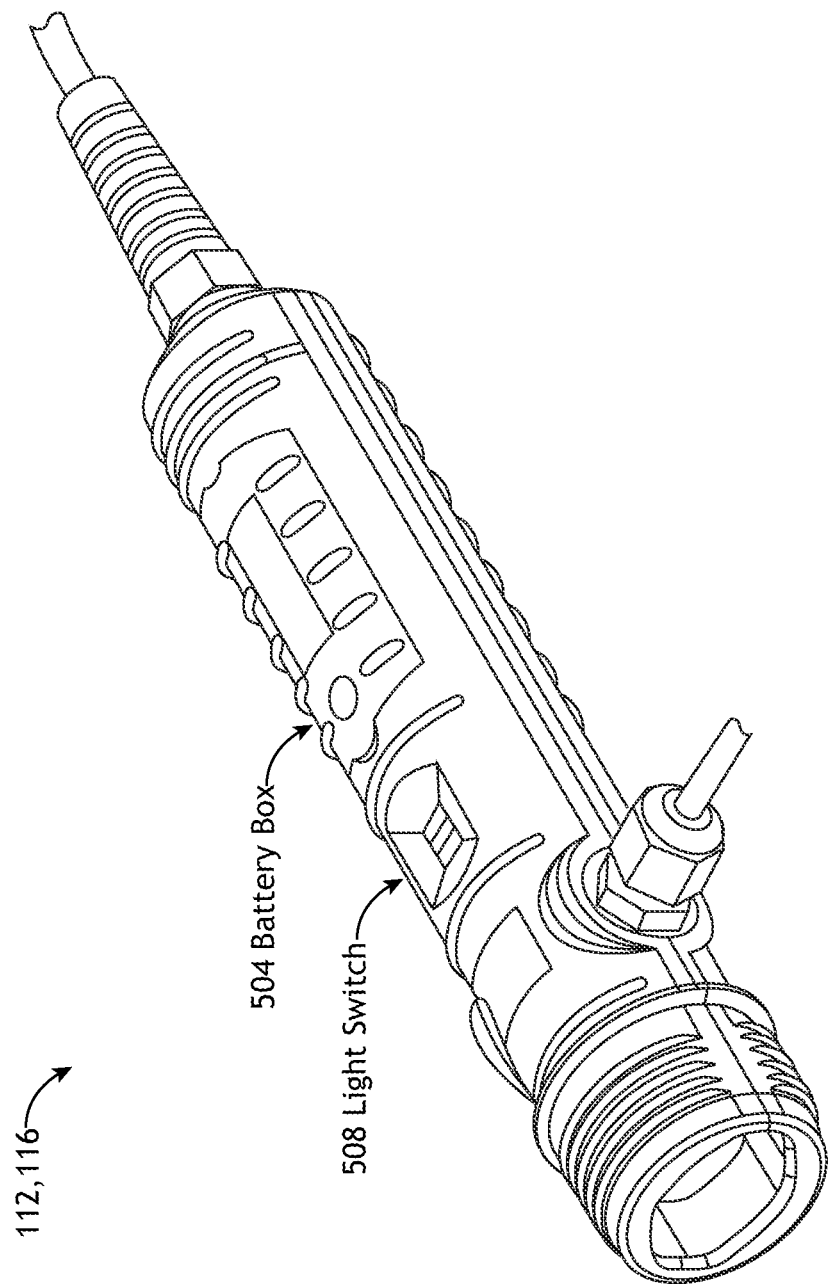
FIG. 5 is a diagram illustrating the housing of a probe assembly, in accordance with one or more embodiments of the disclosure.

The battery probe set 100 may be configured to power the light source 404 via a power source (e.g., a disposable or rechargeable battery) disposed within the housing 112, 116 (e.g., the power source electrically coupled to the light source 404). The power source may be configured as any type or kind of battery, and contain any number of batteries. For example, the power source may be configured as three LR44 alkaline button batteries. In another example, the light source 404 may be configured as a single 1.5 V AA battery. Referring to FIG. 5, the housing 112, 116 may include a battery box 504 configured to receive one or more batteries to power the light source 404. The housing 112, 116 may further include a light switch 508 configured to switch the light source 404 to an ON or OFF status. The battery probe set 100 may include other configurations for powering the light source 404. For example, the light source 404 may be powered by a disposable battery stored in the probe tip 128. In another example, the light source 404 may be powered by the battery 216 that is being tested.

Figure 6:
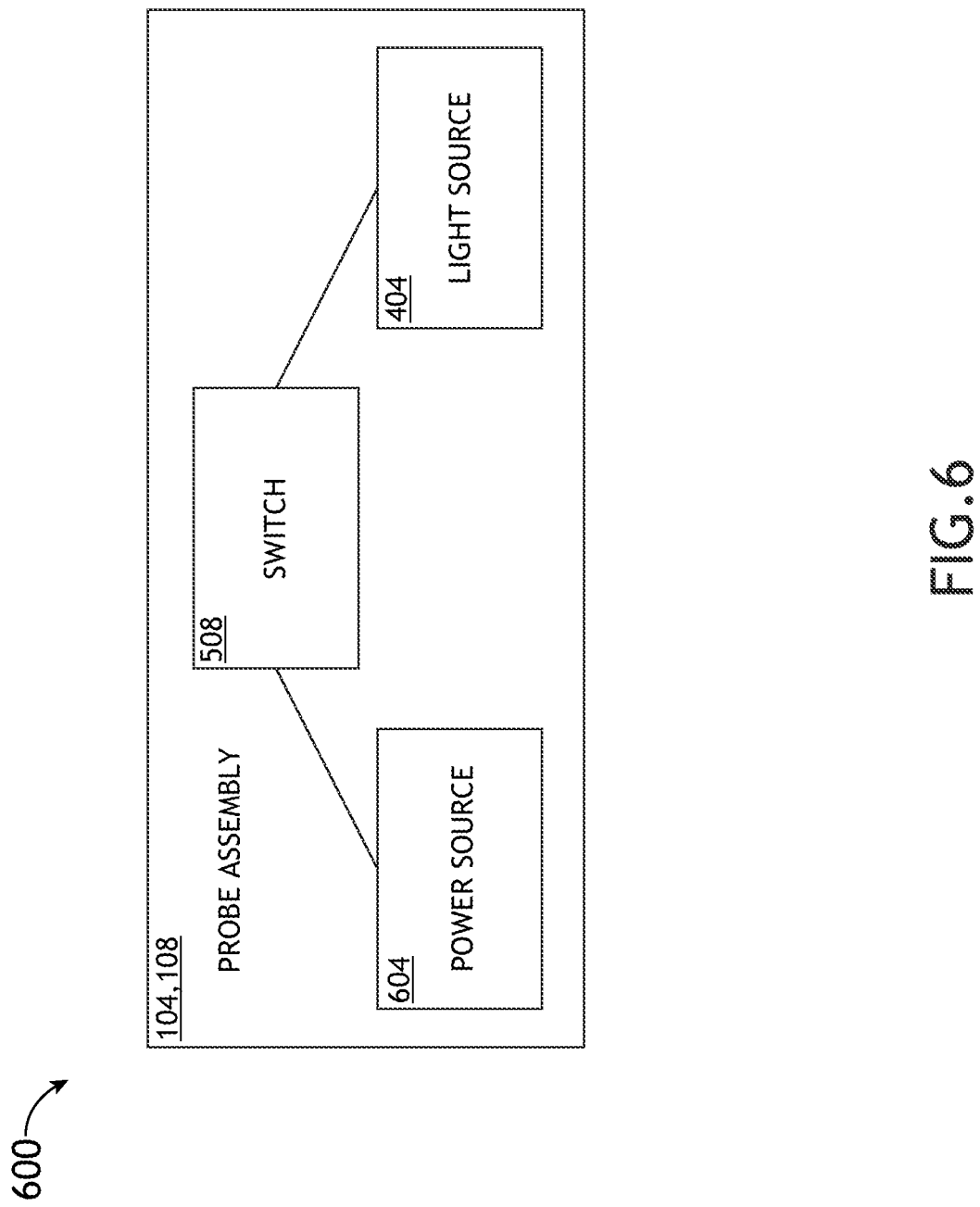
FIG. 6 is a block diagram illustrating electronic circuitry within the probe assembly for powering a light source, in accordance with one or more embodiments of the disclosure.

FIG. 6 is a block diagram illustrating electronic circuitry 600 within the probe assembly 104, 108 for powering the light source 404, in accordance with one or more embodiments of this disclosure. The power source 604 (e.g., the probe battery), the light source 404, and the light switch 508 are arranged in a circuit, with the power source 604 powering the light source 404, and the light switch 508 controlling the flow of current through the circuit.

Figure 7:
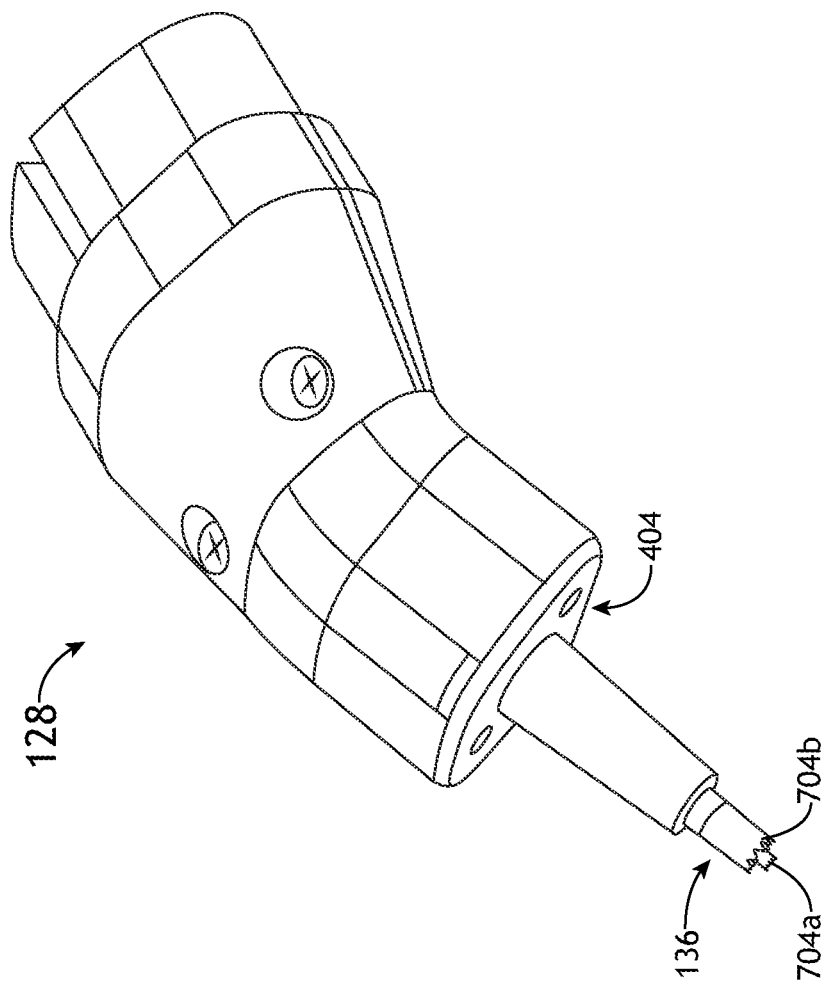
FIG. 7 is a diagram illustrating a probe tip, in accordance with one or more embodiments of the disclosure.

Referring to FIG. 7, the conductive pin 136 may be configured to impinge stably upon the battery terminal 212*a-b*. For example, the conductive pin 136 may be configured with one or more sawtooth rings 704*a-b*, wherein the sharp points of the sawtooth rings 704*a-b* are configured to impinge upon and provide a foothold onto the battery terminal 212*a-b*. The conductive pin 136 is configured to provide a solid and stable physical connection between the probe set and terminals from a variety of manufacturers (e.g., via the impingement of the sawtooth rings 704*a-b*). For example, the probe tip 128 is configured to stably contact side terminals, stud post terminals, fast-on connector style terminals and/or front access battery terminal 212*a-b*. In some embodiments, the conductive pin 136 is removable and/or replaceable. Other types of conductive pin 136 structure are possible. Therefore, the above description should not be interpreted as a limitation of the present disclosure, but merely an illustration.

Figure 8:
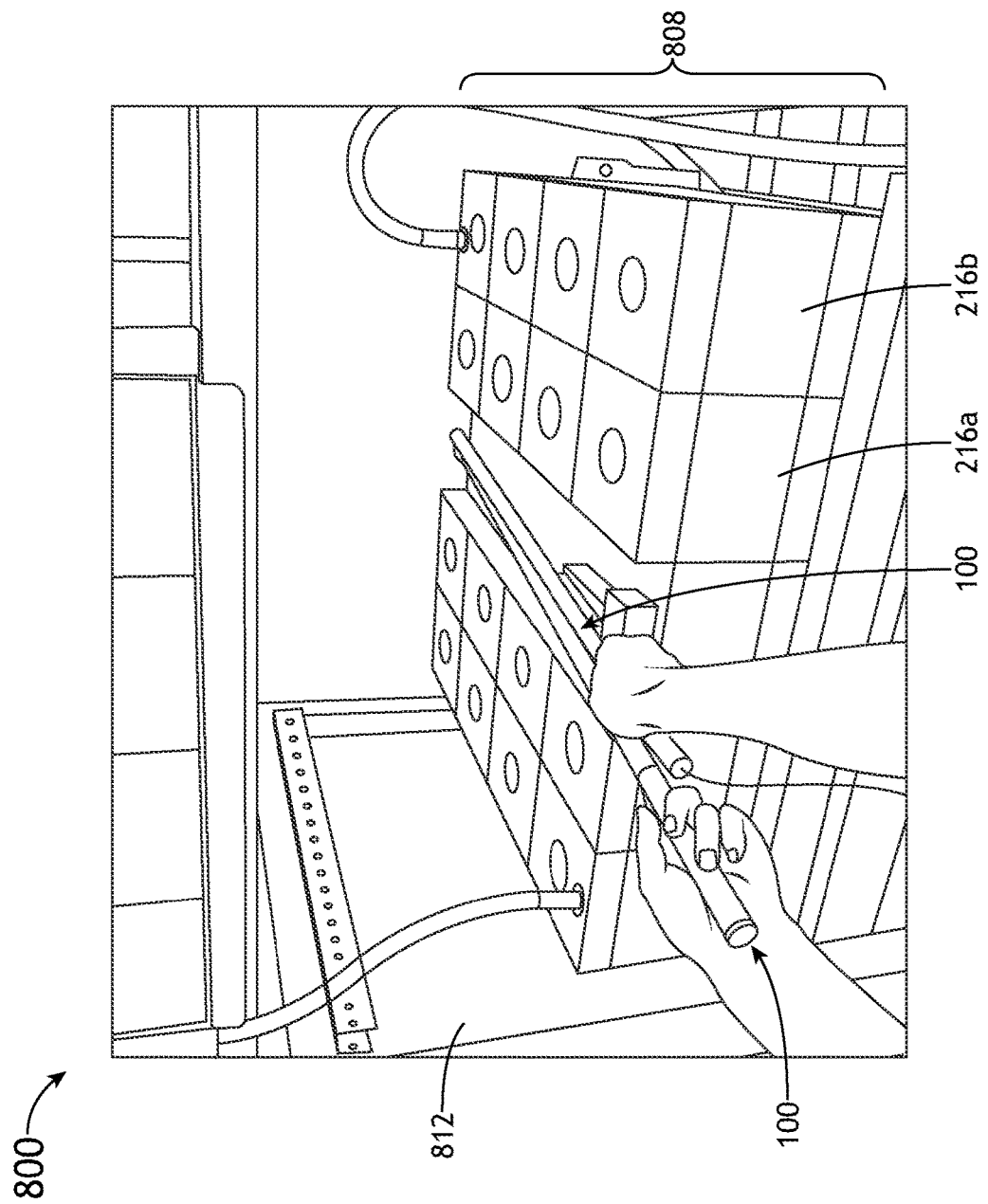
FIG. 8 is a battery probe set being used to probe a battery within a battery cabinet, in accordance with one or more embodiments of the disclosure.

FIG. 8 illustrates an exemplary environment 800 for operating the battery probe set 100, in accordance with one or embodiments of this disclosure. Referring to FIG. 8, the battery probe set 100 is probing a single battery of an array of batteries in a cabinet 812. The first probe assembly 104 and the second probe assembly 108 are both configured with a long probe stem 124. The user is able to take measurements of a battery deep within the cabinet space via the battery probe set 100 without having to reach inside the cabinet space, as the long probe stem 124 provides the necessary length to the first probe assembly 104 and the second probe assembly 108. The array of batteries (e.g., the battery string) does not need to be disassembled in order to take measurements from single batteries 216*a-b*. The length of the battery probe set 100 also reduces the need for the user to wear protective clothing, such as an arc flash suit.

The battery probe set 100 may be configured for any type or kind of battery tester 224. For example, the battery probe set 100 may be configured for a battery resistance tester. For instance, the battery probe set 100 may be configured for a battery resistance tester manufactured by the Hioki company. In another instance, the battery probe set 100 may be configured for a battery resistance tester manufactured by the Fluke company. In another example, the battery probe set 100 may be configured for a battery conductance tester. For instance, the battery probe set 100 may be configured for a battery conductance tester manufactured by the Midtronics company. The battery probe set 100 may be configured with any type of probe plug 140 compatible with any type of battery tester 224.

The battery probe set 100 may be configured to probe any range of voltage, current or resistance for measurement by an associated battery tester 224. For example, the battery probe set 100 may be configured along with a battery tester 224 to measure resistances between a range of 400 μΩ to 20 mΩ. In another example, the battery probe set 100 may be configured along with a battery tester 224 to measure voltages ranging from zero to 100 volts (e.g., volts direct current). In another example, the battery probe set 100 may be configured along with a battery tester 224 to measure current in batteries configured for 10 to 6000 ampere hours (Ah). The battery probe set 100 may also be able to measure any number of batteries arranged in series. For example, the battery probe set 100 may be configured to take measurements of two, three, four, or more batteries arranged in series. It is contemplated that measurements may be affected by hand position whereby measurements that are taken with hands placed in closer proximity may yield test results which are different from measurements that are taken with hands spaced by a greater distance. It is contemplated that such measurements may be adjusted to remove any difference in test results created by hand placement.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed is:

1. A battery probe set, comprising:
   a first probe assembly, comprising:
      a first probe tip;
      a first housing configured with a first gripping portion;
      a first electronic circuitry within the first housing; and
      a first probe stem configured to mechanically couple to a first end of the first housing; and
   a second probe assembly, comprising:
      a second probe tip;
      a second housing configured with a second gripping portion;
      a second electronic circuitry within the second housing; and
      a second probe stem configured to mechanically couple to a first end of the second housing, wherein the first probe tip is configured to be replaceable between first probe tips with conductive pins of different angles relative to the first probe stem, wherein the conductive pin includes a sharp point configured to impinge upon a battery terminal, the conductive pin further includes a sawtooth ring.

2. The battery probe set of claim 1, wherein at least one of the first probe tip or the second probe tip is configured with a probe light.

3. The battery probe of claim 1, wherein at least one of the first probe stem or the second probe stem is configured to be replaceable between probe stems of different lengths.

4. The battery probe set of claim 1, wherein at least one of the first probe stem and/or the second probe stem has a length of greater than 750 mm.

5. The battery probe set of claim 1, wherein the first probe tip is configured with a conductive pin communicatively coupled to the first conductive path oriented at an angle of approximately 45° relative to the first probe stem.

6. The battery probe set of claim 1, wherein the first probe tip is configured with a conductive pin communicatively coupled to the first conductive path oriented at an angle of approximately 30° relative to the first probe stem.

7. The battery probe set of claim 1, further comprising:
   a probe light; and
   a battery box disposed within at least one of the first gripping portion or the second gripping portion configured to store a battery, wherein the battery is configured to power the probe light.

8. The battery probe set of claim 1, wherein the first probe tip further comprises a trigger mechanism, wherein the trigger mechanism is activated by pressing the first probe tip against a battery terminal.

9. The battery probe set of claim 1, wherein the battery probe set is configured to communicatively couple to a battery tester, wherein the battery tester is configured to measure resistances between a range of 400μΩ to 20 mΩ via the battery probe set.

10. The battery probe set of claim 1, wherein the battery probe set is configured to couple to a battery tester, wherein the battery tester is configured to measure current ranging from 10 to 6000 ampere hours via the battery probe set.

* * * * *